(12) United States Patent
Wada et al.

(10) Patent No.: US 6,696,680 B2
(45) Date of Patent: Feb. 24, 2004

(54) VARIABLE RESISTANCE CIRCUIT, OPERATIONAL AMPLIFICATION CIRCUIT AND SEMICONDUCTOR INTEGRATED CIRCUIT

(75) Inventors: Atsushi Wada, Ogaki (JP); Takeshi Otsuka, Gifu-ken (JP); Kuniyuki Tani, Ogaki (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 10/358,310

(22) Filed: Feb. 5, 2003

(65) Prior Publication Data

US 2003/0122056 A1 Jul. 3, 2003

Related U.S. Application Data

(62) Division of application No. 10/137,427, filed on May 3, 2002, now Pat. No. 6,538,246, which is a division of application No. 09/795,443, filed on Mar. 1, 2001, now Pat. No. 6,403,943.

(30) Foreign Application Priority Data

| Mar. 2, 2000 | (JP) | 2000-056771 |
| Mar. 24, 2000 | (JP) | 2000-084804 |
| Mar. 28, 2000 | (JP) | 2000-089806 |

(51) Int. Cl.$^7$ ................................. H01J 40/14
(52) U.S. Cl. ......................... 250/214 R; 250/214 LS
(58) Field of Search ................ 250/214 R, 214 A, 250/214 LS, 214 SW, 214 LA; 330/89, 308; 327/514, 520, 521; 257/298–307

(56) References Cited

U.S. PATENT DOCUMENTS 3,890,631 A 6/1975 Tiemann 5,029,203 A 7/1991 Ikefuji et al.
6,559,676 B1 * 5/2003 Tomita ........................ 326/81

FOREIGN PATENT DOCUMENTS

| JP | 51-83759 A | 7/1976 |
| JP | 54-94145 A | 7/1979 |
| JP | 58-054714 | 3/1983 |
| JP | 59-186411 A | 10/1984 |
| JP | 02-206908 | 8/1990 |
| JP | 04-121832 | 4/1992 |
| JP | 04-218902 | 8/1992 |
| JP | 09-139642 | 5/1997 |
| JP | 11-007639 | 1/1999 |
| JP | 11-203691 | 7/1999 |

* cited by examiner

Primary Examiner—Que T. Le
(74) Attorney, Agent, or Firm—Westerman, Hattori, Daniels & Adrian, LLP

(57) ABSTRACT

A variable resistance circuit comprises a resistance circuit including a plurality of resistors serially connected, and a bypass circuit connected in parallel with the resistance circuit for bypassing one or more resistors selected from the plurality of resistors. The bypass circuit includes a plurality of transistors selectively turned on or off. The variable resistance value is determined by a combined resistance value of a parasitic resistance of one or more transistors being turned on and one or more resistors being bypassed as well as a combined resistance value of one or more resistors being not bypassed. The gate widths of the plurality of transistors are so set that the variable resistance value varies approximately in steps of a predetermined value. Various resistance values can be set in high precision by selectively turning on or off the plurality of transistors.

20 Claims, 9 Drawing Sheets

VARIABLE RESISTANCE CIRCUIT, OPERATIONAL AMPLIFICATION CIRCUIT AND SEMICONDUCTOR INTEGRATED CIRCUIT

This application is a Division of Ser. No. 10/137,427 filed May 3, 2002 now U.S. Pat. No. 6,538,246 which is a Division of Ser. No. 09/795,443 filed March 1, 2001 now U.S. Pat. No. 6,403,943.

BACKGROUND OF THE INVENTION

1. Field of the Invention

The present invention relates to a variable resistance circuit that has a variable resistance value being gradually variable, an operational amplification circuit employing this variable resistance circuit, and a semiconductor integrated circuit employing this operational amplification circuit.

2. Description of the Background Art

In recent years, optical disk drives such as a CD (compact disk) drive, a CD-ROM (compact disk read only memory) drive and the like come into wide use, followed by development of various semiconductor integrated circuits applied to these optical disk drives.

FIG. 7 is a block diagram showing the structure of a conventional semiconductor integrated circuit applied to a CD-ROM drive.

The circuit shown in FIG. 7, formed by a plurality of semiconductor integrated circuits, comprises a signal processing circuit 200, an RF (radio frequency) amplifier 220, a drive circuit 230, a microcomputer 240 and a DRAM (dynamic random access memory) 250.

The signal processing circuit 200 includes a DSP (digital signal processor) 201, a DAC (digital-to-analog converter) 202, a servo circuit 203 and an error correction circuit 204. The RF amplifier 220 is formed by a bipolar integrated circuit with different components, and the signal processing circuit 200 is integrated into a single chip by a CMOS (complementary metal oxide semiconductor) integrated circuit.

An optical pickup 210 converts data recorded on a CD-ROM disk to an RF signal, and outputs the RF signal to the RF amplifier 220. The RF amplifier 220 generates a reproduced signal (EFM (eight to fourteen modulation) signal), a focus error signal and a tracking error signal etc., and outputs these signals to the signal processing circuit 200.

The signal processing circuit 200 creates a control signal for controlling the optical pickup 210 from the focus error signal, the tracking error signal etc. through the DSP 201 and the servo circuit 203, and outputs the control signal to the drive circuit 230. The drive circuit 230 drives an actuator provided in the optical pickup 210 in response to the input control signal, for controlling the optical pickup 210 to reproduce an excellent RF signal.

The signal processing circuit 200 further performs error correction of the reproduced data by the error correction circuit 204 with the DRAM 250, for converting the reproduced data to an analog signal by the DAC 202 and outputting the analog signal when reproducing a sound signal.

The microcomputer 240 serves as a system controller controlling operations of the overall drive and transmits/receives data etc. to/from the signal processing circuit 200 at need so that the CD-ROM drive executes various operations.

The RF amplifier 220 of the CD-ROM drive having the aforementioned structure internally varies the amplification factor for the RF signal with various levels of RF signals for reproducing data from various optical disks such as a CD, a CD-ROM, a CD-RW (compact disk rewritable) and the like. Therefore, the RF amplifier 220 comprises a PGA (programmable gain amplifier) or the like varying the amplification factor for the RF signal, and employs a variable resistance circuit settable to various resistance values for gain control.

FIG. 8 is a circuit diagram showing the structure of a conventional variable resistance circuit. The variable resistance circuit shown in FIG. 8 includes a decoding circuit 300, switches SW0 to SW255 and resistors TR0 to TR255.

The 256 resistors TR0 to TR255 are serially connected with each other, the resistance values of all resistors TR0 to TR255 are set to R ($\Omega$), and the resistors TR0 to TR255 are identical to each other. The switches SW0 to SW255, connected in parallel with the corresponding ones of the resistors TR0 to TR255 respectively, are identical to each other. When the switches SW0 to SW255 are turned on, the resistors TR0 to TR255 connected therewith are so bypassed as to change the resistance value of the variable resistance circuit.

Control signals d1 to d8 of eight bits are input in the decoding circuit 300. The control signal d1 expresses the least significant bit, the control signal d8 expresses the most significant bit, and the respective values of 0 to 255 can be expressed by the control signals d1 to d8. The decoding circuit 300 decodes the control signals d1 to d8 of eight bits and outputs control signals for turning on/off the switches SW0 to SW255 and setting resistance values corresponding to data expressed by the control signals d1 to d8 of eight bits to the switches SW0 to SW255.

The switches SW0 to SW255 are turned on/off by the control signals output from the decoding circuit 300 respectively, and the ON-state switches bypass the resistors. Therefore, the resistance value of the variable resistance circuit is set to an arbitrary value among 0 ($\Omega$), R ($\Omega$), 2R ($\Omega$), ..., 255R ($\Omega$) by bypassing an arbitrary resistor among the 256 resistors TR0 to TR255 in response to the control signals d1 to d8 of eight bits.

FIG. 9 is a circuit diagram showing the structure of another conventional variable resistance circuit. The variable resistance circuit shown in FIG. 9 includes switches SW10 to SW17 and resistors TR10 to TR17. The eight resistors TR10 to TR17 are serially connected with each other. The resistors TR10, TR11 and TR12 have resistance values R ($\Omega$), 2R ($\Omega$) and 4R ($\Omega$) respectively, and the resistance values of the subsequent resistors TR13 to TR17 are successively doubled so that the resistance value of the final resistor TR17 is set to 128 R ($\Omega$).

The switches SW10 to SW17 are connected in parallel with the corresponding ones of the resistors TR10 to TR17 respectively, and turned on/off thereby bypassing the resistors TR10 to TR17 connected therewith.

The aforementioned control signals d1 to d8 of eight bits are input in the switches SW10 to SW17 respectively, for setting the resistance value of the variable resistance circuit to an arbitrary value among 0 ($\Omega$), 2R ($\Omega$), ..., 255R ($\Omega$).

Linearity of the resistance value of the variable resistance circuit shown in FIG. 9 is deteriorated due to parasitic resistances of the switches SW10 to SW17. Assuming that the parasitic resistance value of each of the switches SW10 to SW17 is r ($\Omega$), the resistance value of the variable resistance circuit is 255R ($\Omega$) when all switches SW0 to SW17 are off, 254R+r×R/(r+R) ($\Omega$) when the switch SW10 is on and the switches SW11 to SW17 are off, 253R+2r×R/

(r+2R) (Ω) when the switch SW11 is on and the switches SW10 and SW12 to SW17 are off, or 252R+r×R/(r+R)+2r×R/(r+2R) (Ω) when the switches SW10 and SW11 are on and the switches SW12 to SW17 are off.

Thus, the change rate of the resistance value of the variable resistance circuit is R−r×R/(r+R) (Ω), R+r×R/(r+R)−2r×R/(r+2R) (Ω) or R−r×R/(r+R) (Ω). In other words, even if the change rate of the resistance value by the resistors TR10 to TR17 is constant, the change rate of the resistance value by the parasitic resistances of the switches SW10 to SW17 is not constant. Therefore, the change rate is not constant but the linearity of the resistance value of the variable resistance circuit is deteriorated due to the parasitic resistances of the switches SW10 to SW17.

SUMMARY OF THE INVENTION

An object of the present invention is to provide a variable resistance circuit capable of setting the resistance value in high precision, an operational amplification circuit employing this variable resistance circuit and a semiconductor integrated circuit employing this operational amplification circuit.

A variable resistance circuit that has a variable resistance value being gradually variable, according to one aspect of the present invention, comprises a resistance circuit including a plurality of resistors serially connected and a bypass circuit connected in parallel with the resistance circuit for bypassing one or more resistors selected from the plurality of resistors, wherein the bypass circuit includes a plurality of transistors selectively turned on or off, the variable resistance value is determined by a combined resistance value of a parasitic resistance of one or more transistors being turned on and one or more resistors being bypassed as well as a combined resistance value of one or more resistors being not bypassed, and gate widths of the plurality of transistors are so set that the variable resistance value varies approximately in steps of a predetermined value.

In the variabe resistance circuit, the variable resistance value is determined by a combined resistance value of a parasitic resistance of one or more transistors being turned on and one or more resistors being bypassed as well as a combined resistance value of one or more resistors being not bypassed. Thus, various resistance values can be set by selectively turning on or off the plurality of transistors. The gate widths of the plurality of transistors are so set that the variable resistance value varies approximately in steps of a predetermined value. Thus, linearity of the variable resistance value can be ensured. Consequently, the resistance value can be set in high precision.

The plurality of transistors may be connected to ends of the plurality of resistors respectively.

A variable resistance circuit that has a variable resistance value being gradually variable, according to another aspect of the present invention, comprises a resistance circuit including a plurality of resistors serially connected; and a switch circuit connected in parallel with the resistance circuit for bypassing one or more resistors selected from the plurality of resistors, wherein the switch circuit includes a plurality of switches selectively turned on or off, the variable resistance value is determined by a combined resistance value of a parasitic resistance of one or more switches being turned on and one ore more resistors being bypassed as well as a combined resistance value of one or more resistors being not bypassed, and parasitic resistance values of the plurality of switches in an ON state are so set that the variable resistance value varies approximately in steps of a predetermined value.

In the variabe resistance circuit, the variable resistance value is determined by a combined resistance value of a parasitic resistance of one or more switches being turned on and one or more resistors being bypassed as well as a combined resistance value of one or more resistors being not bypassed. Thus, various resistance values can be set by selectively turning on or off the plurality of switches. The parasitic resistance values of the plurality of switches in an ON state are so set that the variable resistance value varies approximately in steps of a predetermined value. Thus, linearity of the variable resistance value can be ensured. Consequently, the resistance value can be set in high precision.

The plurality of switches may include a plurality of transistors connected to ends of the plurality of resistors respectively. Each of the plurality of switches may include a CMOS switch. In this case, a circuit including the variable resistance circuit can be formed by a CMOS integrated circuit.

A variable resistance circuit that has a variable resistance value being gradually variable, according to still another aspect of the present invention, comprises a resistance circuit including a plurality of resistors serially connected; and a bypass circuit connected in parallel with the resistance circuit for bypassing one or more resistors selected from the plurality of resistors, wherein the bypass circuit includes a plurality of: transistors selectively turned on or off, the plurality of transistors are connected to ends of the plurality of resistors respectively, and gate widths of the plurality of transistors are so set that the variable resistance value varies approximately in steps of a predetermined value.

In the variabe resistance circuit, the bypass circuit includes a plurality of transistors selectively turned on or off, the plurality of transistors are connected to ends of the plurality of resistors respectively. Thus, various resistance values can be set by selectively turning on or off the plurality of transistors. The gate widths of the plurality of transistors are so set that the variable resistance value varies approximately in steps of a predetermined value. Thus, linearity of the variable resistance value can be ensured. Consequently, the resistance value can be set in high precision.

A variable resistance circuit that has a variable resistance value being gradually variable, according to still another aspect of the present invention, comprises a resistance circuit including a plurality of resistors serially connected; and a switch circuit connected in parallel with the resistance circuit for bypassing one or more resistors selected from the plurality of resistors, wherein the switch circuit includes a plurality of switches selectively turned on or off, the plurality of switches are connected to ends of the plurality of resistors, and parasitic resistance values of the plurality of switches in an ON state are so set that the variable resistance value varies approximately in steps of a predetermined value.

In the variable resistance circuit, the switch circuit includes a plurality of switches selectively turned on or off, and the plurality of switches are connected to ends of the plurality of resistors. Thus, various resistance values can be set by selectively turning on or off the plurality of switches. The parasitic resistance values of the plurality of switches in an ON state are so set that the variable resistance value varies approximately in steps of a predetermined value. Thus, linearity of the variable resistance value can be ensured. Consequently, the resistance value can be set in high precision.

Each of the plurality of switches may include a CMOS switch. In this case, a circuit including the variable resistance circuit can be formed by a CMOS integrated circuit.

A variable resistance circuit that has a variable resistance value being gradually variable based on a control signal, according to still another aspect of the present invention, comprises a resistance circuit including a plurality of resistors serially connected; and a bypass circuit connected in parallel with the resistance circuit for bypassing one or more resistors selected from the plurality of resistors, wherein the bypass circuit includes a plurality of transistors selectively turned on or off based on the control signal, the variable resistance value is determined by a combined resistance value of a parasitic resistance of one or more transistors being turned on and one or more resistors being bypassed as well as a combined resistance value of one or more resistors being not bypassed, and gate widths of the plurality of transistors are so set that the variable resistance value has approximately linearity with respect to the control signal.

In the variable resistance circuit, the variable resistance value is determined by a combined resistance value of a parasitic resistance of one or more transistors being turned on and one or more resistors being bypassed as well as a combined resistance value of one or more resistors being not bypassed. Thus, various resistance values can be set by selectively turning on or off the plurality of transistors. The gate widths of the plurality of transistors are so set that the variable resistance value has approximately linearity with respect to the control signal. Thus, plurality of the variable resistance value can be ensured. Consequently, the resistance value can be set in high precision.

The plurality of transistors may be connected to ends of the plurality of resistors respectively.

A variable resistance circuit that has a variable resistance value being gradually variable based on a control signal, according to still another aspect of the present invention, comprises a resistance circuit including a plurality of resistors serially connected; and a switch circuit connected in parallel with the resistance circuit for bypassing one or more resistors selected from the plurality of resistors, wherein the switch circuit includes a plurality of transistors selectively turned on or off based on the control signal, the variable resistance value is determined by a combined resistance value of a parasitic resistance of one or more transistors being turned on and one or more resistors being bypassed as well as a combined resistance value of one or more resistors being not bypassed, and parasitic resistance values of the plurality of switches in an ON state are so set that the variable resistance value has approximately linearity with respect to the control signal.

In the variable resistance circuit, the variable resistance value is determined by a combined resistance value of a parasitic resistance of one or more transistors being turned on and one or more resistors being bypassed as well as a combined resistance value of one or more resistors being not bypassed. Thus, various resistance values can be set by selectively turning on or off the plurality of switches. The parasitic resistance values of the plurality of switches in an ON state are so set that the variable resistance value has approximately linearity with respect to the control signal. Thus, linearity of the variable resistance value can be ensured. Consequently, the resistance value can be set in high precision.

The plurality of switches may include a plurality of transistors connected to ends of the plurality of resistors respectively. Each of the plurality of switches may include a CMOS switch. In this case, a circuit including the variable resistance circuit can be formed by a CMOS integrated circuit.

A variable resistance circuit that has a variable resistance value being gradually variable based on a control signal, according to still another aspect of the present invention, comprises a resistance circuit including a plurality of resistors serially connected; and a bypass circuit connected in parallel with the resistance circuit for bypassing one or more resistors selected from the plurality of resistors, wherein the bypass circuit includes a plurality of transistors selectively turned on or off based on a control signal, the plurality of transistors are connected to ends of the plurality of resistors respectively, and gate widths of the, plurality of transistors are so set that the variable resistance value has approximately linearity with respect to the control signal.

In the variable resistance circuit, the bypass circuit includes a plurality of transistors selectively turned on or off based on a control signal, and the plurality of transistors are connected, to ends of the plurality of resistors respectively. Thus, various resistance values can be set by selectively turning on or off the plurality of transistors. The gate widths of the plurality of transistors are so set that the variable resistance value has approximately linearity with respect to the control signal. Thus, linearity of the variable resistance value can be ensured. Consequently, the resistance value can be set in high precision.

A variable resistance circuit that has a variable resistance value being gradually variable based on a control signal, according to still another aspect of the present invention, comprises a resistance circuit including a plurality of resistors serially connected; and a switch circuit connected in parallel with the resistance circuit for bypassing one or more resistors selected from the plurality of resistors, wherein the switch circuit includes a plurality of switches selectively turned on or off based on a control signal, the plurality of switches are connected to ends of the plurality of resistors respectively, and predetermined resistance values of the plurality of switches in an ON state are so set that the variable resistance value has approximately linearity with respect to the control signal.

In the variable resistance circuit, the switch circuit includes a plurality of switches selectively turned on or off based on a control signal, and the plurality of switches are connected to ends of the plurality of resistors respectively. Thus, various resistance values can be set by selectively turning on or off the plurality of switches. The predetermined resistance values of the plurality of switches in an ON state are so set that the variable resistance value has approximately linearity with respect to the control signal. Thus, linearity of the variable resistance value can be ensured. Consequently, the resistance value can be set in high precision.

Each of the plurality of switches may include a CMOS switch. In this case, a circuit including the variable resistance circuit can be formed by a CMOS integrated circuit.

An operational amplification circuit according to another aspect of the present invention comprises a variable resistance circuit and an operational amplifier, connected with the variable resistance circuit, having an amplification factor varying with the resistance value of the variable resistance circuit, while the variable resistance circuit includes a resistance circuit including a plurality of resistors serially connected; and a bypass circuit connected in parallel with the resistance circuit for bypassing one or more resistors selected from the plurality of resistors, wherein the bypass circuit includes a plurality of transistors selectively turned on or off, the plurality of transistors are connected to ends of the plurality of resistors respectively, and gate widths of the plurality of transistors are so set that the variable resistance value varies approximately in steps of a predetermined value.

In the operational amplification circuit, the aforementioned variable resistance circuit is connected with the operational amplifier for varying the amplification factor with the resistance value of the variable resistance circuit capable of varying the resistance value in high precision, whereby the amplification factor can be set in high precision.

An operational amplification circuit according to another aspect of the present invention comprises a variable resistance circuit and an operational amplifier, connected with the variable resistance circuit, having an amplification factor varying with the resistance value of the variable resistance circuit, while the variable resistance circuit includes a resistance circuit including a plurality of resistors serially connected; and a switch circuit connected in parallel with the resistance circuit for bypassing one or more resistors selected from the plurality of resistors, wherein the switch circuit includes a plurality of switches selectively turned on or off, the plurality of switches are connected to ends of the plurality of resistors, and parasitic resistance values of the plurality of switches in an ON state are so set that the variable resistance value varies approximately in steps of a predetermined value.

In the operational amplification circuit, the aforementioned variable resistance circuit is connected with the operational amplifier for varying the amplification factor with the resistance value of the variable resistance circuit capable of varying the resistance value in high precision, whereby the amplification factor can be set in high precision.

A semiconductor integrated circuit according to still another aspect of the present invention, receiving an output signal from an optical pickup, comprises an operational amplification circuit amplifying the output signal from the optical pickup and another circuit, while the operational amplification circuit and the other circuit are integrated into a single chip by a CMOS integrated circuit, the operational amplification circuit includes a variable resistance circuit and an operational amplifier, connected with the variable resistance circuit, having an amplification factor varying with the resistance value of the variable resistance circuit, the variable resistance circuit includes a resistance circuit including a plurality of resistors serially connected; and a bypass circuit connected in parallel with the resistance circuit for bypassing one or more resistors selected from the plurality of resistors, wherein the bypass circuit includes a plurality of transistors selectively turned on or off, the plurality of transistors are connected to ends of the plurality of resistors respectively, and gate widths of the plurality of transistors are so set that the variable resistance value varies approximately in steps of a predetermined value.

The semiconductor integrated circuit employs the aforementioned operational amplification circuit capable of setting the amplification factor in high precision for the amplification circuit amplifying the output signal from the optical pickup, and integrates the amplification circuit and the other circuit into a single chip by the CMOS integrated circuit, whereby a one-chip CMOS integrated circuit for an optical disk drive including a high-precision amplification circuit can be implemented.

A semiconductor integrated circuit according to still another aspect of the present invention, receiving an output signal from an optical pickup, comprises an operational amplification circuit amplifying the output signal from the optical pickup and another circuit, while the operational amplification circuit and the other circuit are integrated into a single chip by a CMOS integrated circuit, the operational amplification circuit includes a variable resistance circuit and an operational amplifier, connected with the variable resistance circuit, having an amplification factor varying with the resistance value of the variable resistance circuit, the variable resistance circuit includes a resistance circuit including a plurality of resistors serially connected; and a switch circuit connected in parallel with the resistance circuit for bypassing one or more resistors selected from the plurality of resistors, wherein the switch circuit includes a plurality of switches selectively turned on or off, the plurality of switches are connected to ends of the plurality of resistors, and parasitic resistance values of the plurality of switches in an ON state are so set that the variable resistance value varies approximately in steps of a predetermined value.

The semiconductor integrated circuit employs the aforementioned operational amplification circuit capable of setting the amplification factor in high precision for the amplification circuit amplifying the output signal from the optical pickup and integrates the amplification circuit and the other circuit into a single chip by the CMOS integrated circuit, whereby a one-chip CMOS integrated circuit for an optical disk drive including a high-precision amplification circuit can be implemented.

Although the present invention has been described and illustrated in detail, it is clearly understood that the same is by way of illustration and example only and is not to be taken by way of limitation, the spirit and scope of the present invention being limited only by the terms of the appended claims.

DESCRIPTION OF THE PREFERRED EMBODIMENTS (First Embodiment)

A first embodiment of the present invention is described with reference to FIGS. 1 to 6.

Figure 1:
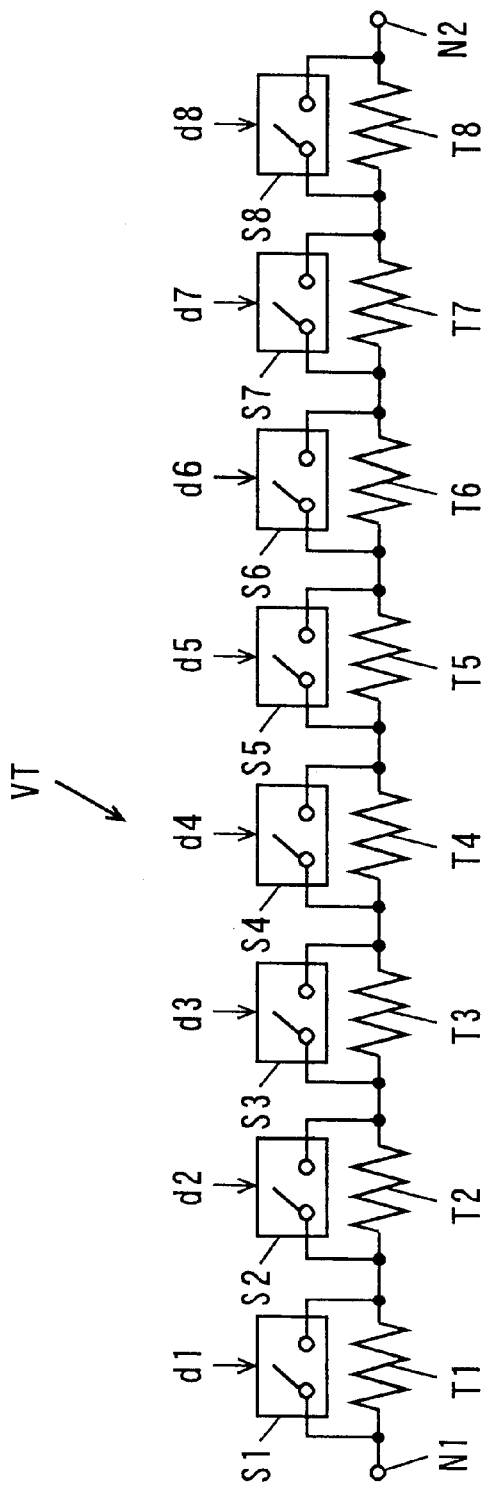
FIG. 1 is a circuit diagram showing the structure of a variable resistance circuit according to a first embodiment of the present invention.

FIG. 1 is a circuit diagram showing the structure of a variable resistance circuit VT according to the first embodiment of the present invention.

Referring to FIG. 1, the variable resistance circuit VT includes resistors T1 to T8 and switches S1 to S8. The resistor T1 is connected between a terminal N1 and the resistor T2, and the switch S1 is connected in parallel with the resistor T1. Similarly, the resistors T2 to T8 and the switches S2 to S8 connected in parallel with each other are serially connected. Control signals d1 to d8 of eight bits are input in the switches S1 to S8 respectively so that the switches S1 to S8 are turned on/off in response to the control signals d1 to d8.

The resistors T1 and T2 have resistance values R ($\Omega$) and 2R ($\Omega$) respectively, and the resistance values of the subsequent resistors T3 to T8 are successively doubled. In other words, each resistance value of the resistors T1 to T8 is set to $R \times 2^i$ (i=0 to 7) ($\Omega$). The resistance value of each parasitic resistance of the switches S1 to S8 in an ON state is set to $r \times 2^i$ (i=0 to 7) ($\Omega$). Therefore, the resistance values of the resistors T1 to T8 and the resistance values of the parasitic resistances of the switches S1 to S8 connected in parallel with the resistors T1 to T8 are in proportion to each other.

Among the control signals d1 to d8 corresponding to data of eight bits, the control signal d1 corresponds to the least significant bit, and the control signal d8 corresponds to the most significant bit. Thus, values 0 to 255 can be expressed by the control signals d1 to d8. The switches S1 to S8 are turned off when the control signals d1 to d8 are 1, while the former are turned on when the latter are zero for bypassing the resistors connected with the ON-state switches.

When 1, 1, 1, 1, 1, 1, 1 and 1 are input in the switches S1 to S8 as the control signals d1 to d8 respectively, for example, all switches S1 to S8 are turned off and the resistance values of the resistors T1 to T8 are added up so that the resistance value of the variable resistance circuit VT is 255R ($\Omega$).

When 0, 1, 1, 1, 1, 1, 1 and 1 are input as the control signals d1 to d8 respectively, the switch S1 is turned on and the switches S2 to S8 are turned off. At this time, the resistors T2 to T8 are serially connected and the resistance value of this part reaches 254R ($\Omega$), the combined resistance value of the switch S1 and the resistor T1 is $r \times R/(r+R)$ ($\Omega$), and the resistance value of the variable resistance circuit VT is $254R + r \times R/(r+R)$ ($\Omega$).

When 1, 0, 1, 1, 1, 1, 1 and 1 are input as the control signals d1 to d8 respectively, the resistance value of the variable resistance circuit VT is $253R + 2r \times R/(r+R)$ ($\Omega$). The resistance value of the variable resistance circuit VT thereafter similarly varies with the control signals d1 to d8, to reach $R + 254r \times R/(r+R)$ ($\Omega$) when 1, 0, 0, 0, 0, 0, 0 and 0 are input or reach $R + 255r \times R/(r+R)$ ($\Omega$) when 0, 0, 0, 0, 0, 0, 0 and 0 are input.

As hereinabove described, the resistance value of the variable resistance circuit VT varies by $R - r \times R/(r+R)$ ($\Omega$) with the control signals d1 to d8. Thus, the resistance value of the variable resistance circuit VT varies by the constant rate $R - r \times R/(r+R)$ ($\Omega$), and can ensure linearity.

While eight resistors T1 to T8 and eight switches S1 to S8 are employed in the above description, the numbers of the serially connected resistors and switches are not particularly restricted to the above but other numbers of resistors and switches may be employed in response to the resistance value to be varied etc. Further, the resistance values of the resistors T1 to T8 are not particularly restricted to the above either but various resistance values can be employed in response to the resistance value to be varied etc. while the arrangement of the resistance values is not particularly restricted to the aforementioned arrangement successively increased from the terminal N1 toward the terminal N2 but the resistors T1 to T8 may be arranged on different positions. In addition, the resistance values of the parasitic resistances may not be completely in proportion to the resistance values of the resistors T1 to T8 but may be in positive correlation similar to proportion to the resistance values of the resistors T1 to T8.

Figure 2:
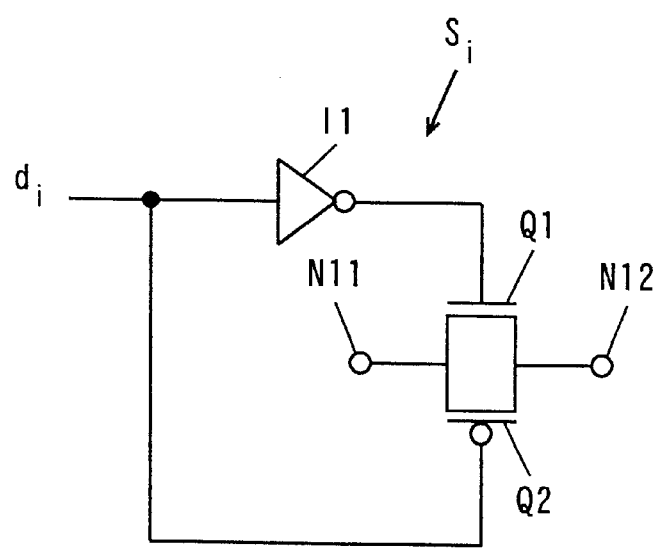
FIG. 2 is a circuit diagram showing an exemplary switch shown in FIG. 1.

FIG. 2 is a circuit diagram showing an exemplary switch S1 forming each of the switches S1 to S8 shown in FIG. 1. The switch S1 shown in FIG. 2 includes an N-channel MOS field-effect transistor (hereinafter referred to as an NMOS transistor) Q1, a p-channel MOS field-effect transistor (hereinafter referred to as a PMOS transistor) Q2 and an inverter I1.

The NMOS transistor Q1 and the PMOS transistor Q2 are connected between the terminals N11 and N12, so that the control signal di (i=1 to 8) is input in the gate of the NMOS transistor Q1 through the inverter I1 and also input in the gate of the PMOS transistor Q2 for forming a CMOS switch. Therefore, the NMOS transistor Q1 and the PMOS transistor Q2 are turned off when 1 is input as the control signal di, and turned on when 0 is input.

When employing CMOS switches each having the aforementioned structure for the switches S1 to S8 shown in FIG. 1, the gate lengths of the NMOS transistors Q1 and the PMOS transistors Q2 are set constant, gate widths W are varied and the resistance values of the parasitic resistances of the switches S1 to s8 are set as described above.

Assuming that W represents the gate width W of the NMOS transistor Q1 and the PMOS transistor Q2 of the switch S1, the gate width of the NMOS transistor Q1 and the PMOS transistor Q2 of the switch S2 is set to W/2, the gate width of the NMOS transistor Q1 and the PMOS transistor Q2 of the switch S3 is set to W/4, and the gate widths of the remaining switches S4 to S8 are successively halved. The resistance values of the parasitic resistances of the CMOS switches can be set to $r \times 2^i$ (i=0 to 7) ($\Omega$) by varying the gate widths in the aforementioned, manner.

When forming the switches S1 to S8 by transistors as described above, the linearity of the variable resistance circuit VT is independent of the resistance values of the parasitic resistances and hence the transistor sizes may not be particularly increased but the circuit area of the variable resistance circuit VT can be reduced.

The switches S1 to S8 are not particularly restricted to the aforementioned CMOS switches but may be formed by other switches so far as the resistance values of the parasitic resistances in ON states can beset in response to the resistance values of the resistors T1 to T8 connected therewith. Further, the gate widths of the transistors may not be completely in inverse proportion to the resistance values of the resistors T1 to T8 but may be in negative correlation similar to inverse proportion to the resistance values of the resistors T1 to T8.

Figure 3:
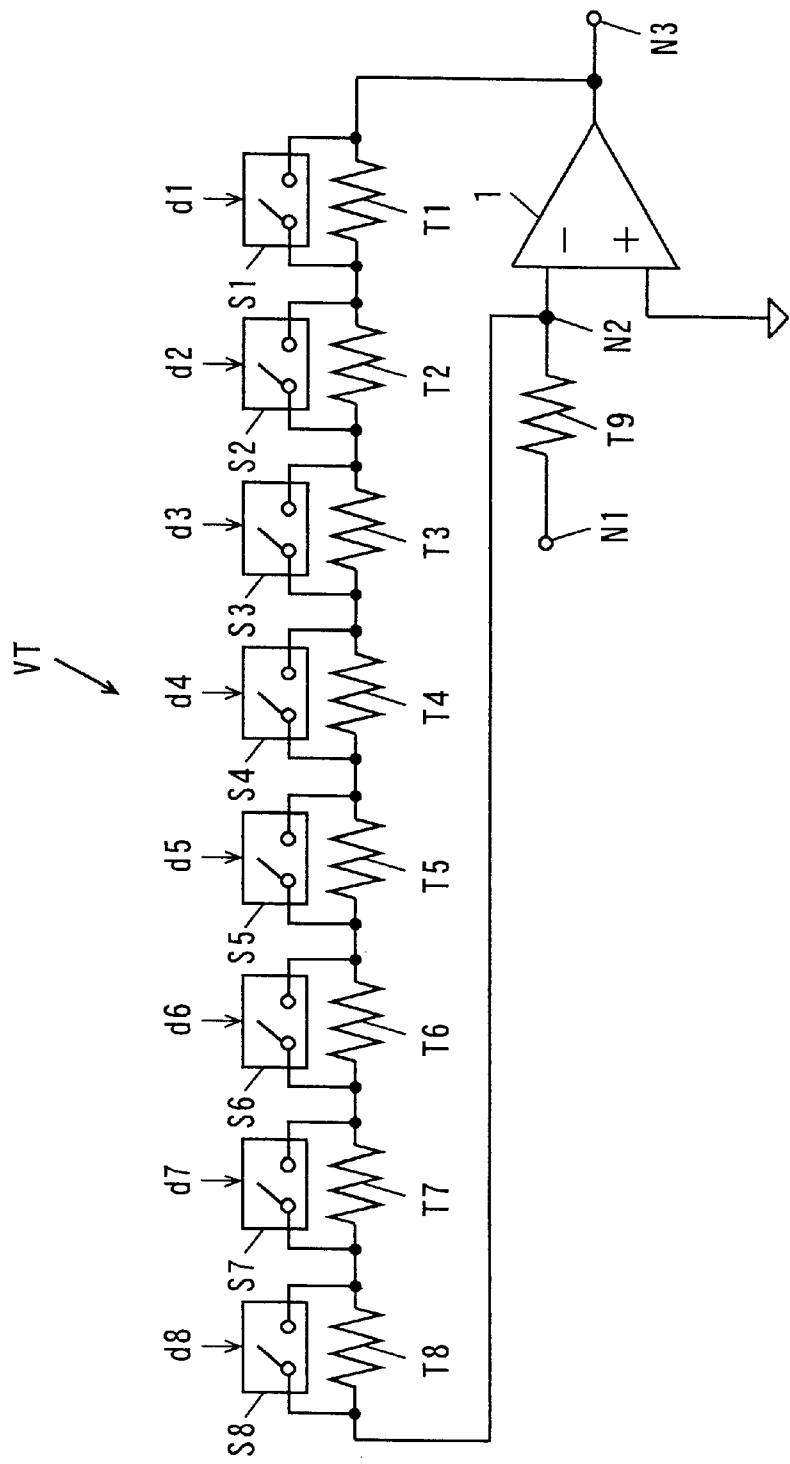
FIG. 3 illustrates an exemplary operational amplification circuit employing the variable resistance circuit shown in FIG. 1.

FIG. 3 illustrates an exemplary operational amplification circuit employing the variable resistance circuit VT shown in FIG. 1. The operational amplification circuit shown in FIG. 3 includes the variable resistance circuit VT, an operational amplifier 1 and a resistor T9.

Referring to FIG. 3, the resistor T9 is connected between an inversion input terminal of the operational amplifier 1 and a terminal N1, while a non-inversion input terminal receives a prescribed reference voltage. The variable resistance circuit VT shown in FIG. 1, forming a negative feedback loop, is connected between the inversion input terminal and an output terminal of the operational amplifier 1, so that the resistor T1 and the switch S1 are connected to the output terminal and the resistor T8 and the switch S8 are connected to the inversion input terminal.

Assuming that VR represents the resistance value of the variable resistance circuit VT and Rf represents the resistance value of the resistor T9, a signal input in the terminal N1 is amplified with an amplification factor of VR/Rf and output from a terminal N3 in the operational amplification circuit shown in FIG. 3, due to the aforementioned structure. At this time, the variable resistance circuit VT can vary the resistance value VR in 256 stages in response to the control signals d1 to d8 with excellent linearity, whereby the signal input from the terminal N1 can be amplified in high precision and output from the terminal N3.

Figure 4:
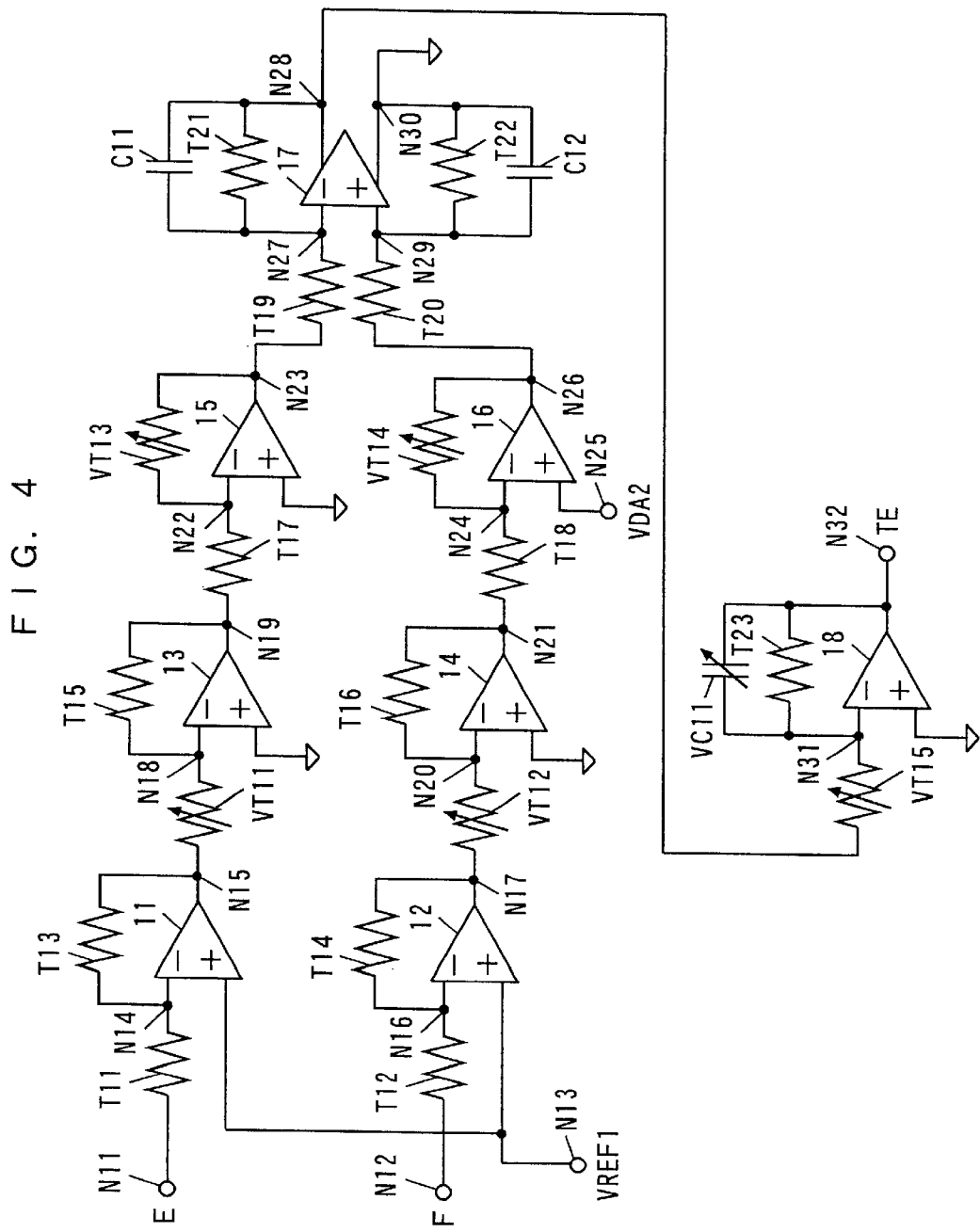
FIG. 4 is a circuit diagram showing the structure of a tracking-system signal processing circuit of an RF amplifier employing the operational amplification circuit shown in FIG. 3.

FIG. 4 is a circuit diagram showing the structure of a tracking-system signal processing part of an RF amplifier employing the operational amplification circuit shown in FIG. 3.

In the RF amplifier for a CD-ROM drive processing each signal output from an optical pickup employing a photodetection part formed by a quartered photodetection part provided at the center for performing focus servo control employing a stigmatism and two photodetection parts provided on both sides of the quartered photodetection part for performing tracking servo control by a three beam method, FIG. 4 shows a part subtracting a tracking signal F of the second tracking servo photodetection part from a tracking signal E from the first tracking servo photodetection part and outputting a tracking error signal TE for performing tracking servo control.

The RF amplifier shown in FIG. 4 includes resistors T11 to T23, operational amplifiers 11 to 18, variable resistance circuits VT11 to VT15, capacitors C11 and C12 and a variable capacitor VC11.

An end of the resistor T11 is connected to a terminal N11, and receives the tracking signal E from the first photodetection part. An inversion input terminal and a non-inversion input terminal of the operational amplifier 11 are connected to the other end of the resistor T11 and a terminal N13 receiving a shift voltage VREF1 respectively, and the resistor T13 is connected between the inversion input terminal and an output terminal. Thus, a level shifting circuit is formed for shifting the tracking signal E input from the terminal T11 from a 5 V-system signal to a 3 V-system signal by the shift voltage VREF1.

The variable resistance circuit VT11 is connected between the output terminal of the operational amplifier 11 and an inversion input terminal of the operational amplifier 13, a non-inversion input terminal of the operational amplifier 13 receives a prescribed reference voltage, and the resistor T15 is connected between the inversion input terminal and an output terminal of the operational amplifier 13. The variable resistance circuit VT11 is formed similarly to the variable resistance circuit VT shown in FIG. 1 with a plurality of resistors, and four types of resistance values can be set for the variable resistance circuit VT11.

Thus, a programmable gain amplifier is so formed that the amplification factor thereof can be set to 0 dB, 6 dB, 14 dB and 20 dB. Therefore, the RF amplifier shown in FIG. 4 is applicable to two types of optical pickups outputting signals of 300 mV and 600 mV by switching the amplification factor to 6 dB, and is also applicable to an optical pickup for a CD-RW drive by switching the amplification factor to 14 dB.

The resistor T17 is connected between the output terminal of the operational amplifier 13 and an inversion input terminal of the operational amplifier 15, a non-inversion input terminal of the operational amplifier 15 receives the prescribed reference voltage, and the variable resistance circuit VT13 is connected between the inversion input terminal and an output terminal of the operational amplifier 15. The variable resistance circuit VT13 is formed similarly to the variable resistance circuit VT shown in FIG. 1, and the resistance value thereof can be switched in 256 stages in response to control signals of eight bits. Thus, a balance circuit is so formed that switching can be made in 256 stages in the rage of 0 dB to 6 dB in response to the control signals of eight bits.

An end of the resistor T12 is connected to the terminal N12, and receives the tracking signal F from the second photodetection part. An inversion input terminal and a non-inversion input terminal of the operational amplifier 12 are connected to the other end of the resistor T12 and the terminal N13 receiving the shift voltage VREF1, and the resistor T14 is connected between the inversion input terminal and an output terminal. Thus, a level shifting circuit is formed for shifting the tracking signal F input from the terminal N12 from a 5 V-system signal to a 3 V-system signal with the shift voltage VREF1.

The variable resistance circuit VT12 is connected between the output terminal of the operational amplifier 12 and an inversion input terminal of the operational amplifier 14, a non-inversion input terminal of the operational amplifier 14 receives the prescribed reference voltage, and the resistor T16 is connected between the inversion input terminal and an output terminal of the operational amplifier 14. The variable resistance circuit VT12 is formed similarly to the variable resistance circuit VT11, and four types of resistance values can be set therefor. Thus, a programmable gain amplifier is so formed that the amplification factor thereof can be set to 0 dB, 6 dB, 14 dB and 20 dB.

The resistor T18 is connected between the output terminal of the operational amplifier 14 and an inversion input terminal of the operational amplifier 16, a non-inversion input terminal of the operational amplifier 16 is connected to a terminal N25 receiving an externally settable reference voltage VDA2, and the variable resistance circuit VT14 is connected between the inversion input terminal and an output terminal of the operational amplifier 16. The variable resistance circuit VT14 is formed similarly to the variable resistance circuit VT13, and the resistance value thereof can be switched in 256 stages in response to control signals of eight bits. Thus, a balance circuit is formed and switching can be made in 256 stages in the range of 0 dB to 6 dB in response to the control signals of eight bits.

The resistor T19 is connected between the output terminal of the operational amplifier 15 and a non-inversion input terminal of the operational amplifier 17, the capacitor C11 and the resistor T21 are connected between an inversion input terminal and a non-inversion output terminal of the operational amplifier 17, the resistor T20 is connected between the output terminal of the operational amplifier 16 and the non-inversion input terminal of the operational amplifier 17, the resistor T22 and the capacitor C12 are connected between the non-inversion input terminal and an inversion output terminal of the operational amplifier 17, and the inversion output terminal of the operational amplifier 17 receives the prescribed reference voltage. Thus, a subtraction circuit is formed and the non-inversion output terminal of the operational amplifier 17 outputs a signal obtained by subtracting the output of the operational amplifier 15 from the output of the operational amplifier 16.

The variable resistance circuit VT15 is connected between the non-inversion output terminal of the operational amplifier 17 and an inversion input terminal of the operational amplifier 18, anon-inversion input terminal of the operational amplifier 18 receives the prescribed reference voltage, and the variable capacitor VC11 and the resistor T23 are connected between the inversion input terminal and an output terminal of the operational amplifier 18.

The variable resistance circuit VT15 is formed similarly to the variable resistance circuit VT shown in FIG. 1 with a plurality of resistors, and the resistance value thereof can be switched in 16 stages with control signals of four bits. The variable capacitor VC11 is so formed that two types of capacitances can be set therefor.

Thus, a programmable gain amplifier is formed and switching can be made in 16 stages in a range of −6 dB to 6 dB in response to the control signals of four bits while two types of frequency characteristics can be set.

Due to the aforementioned structure, the tracking signal E from the first photodetection part is shifted from a 5 V-system signal to a 3 V-system signal with the shift voltage VREF1 by the operational amplifier 11 serving as a level shifting circuit, amplified by the operational amplifier 13 serving as a programmable gain amplifier with the amplification factor of 0 dB, 6 dB, 14 dB or 20 dB and balance-controlled by the operational amplifier 15 serving as a balance circuit at any level of the 256 stages in the range of 0 dB to 6 dB, while the output signal F from the second photodetection part is also processed similarly to the above.

The output signals E and F controlled in level etc. in the aforementioned manner are subjected to subtraction by the operational amplifier 17 serving as a subtraction circuit and finally amplified by the operational amplification circuit 18 with any amplification factor of the 16 stages in the range of −6 dB to 6 dB, for outputting the tracking error signal TE.

A focus-system signal processing part (not shown) is formed similarly to the above, for operating (A+C)−(B+D) with output signals A, B, C and D of the quartered photo-detection part and outputting a focus error signal FE.

As hereinabove described, the RF amplifier shown in FIG. 4 employs a number of variable resistance circuits, while the resistance values thereof can be set in high precision by employing the inventive variable resistance circuit. Therefore, the RF amplifier itself can be improved in precision.

Figure 5:
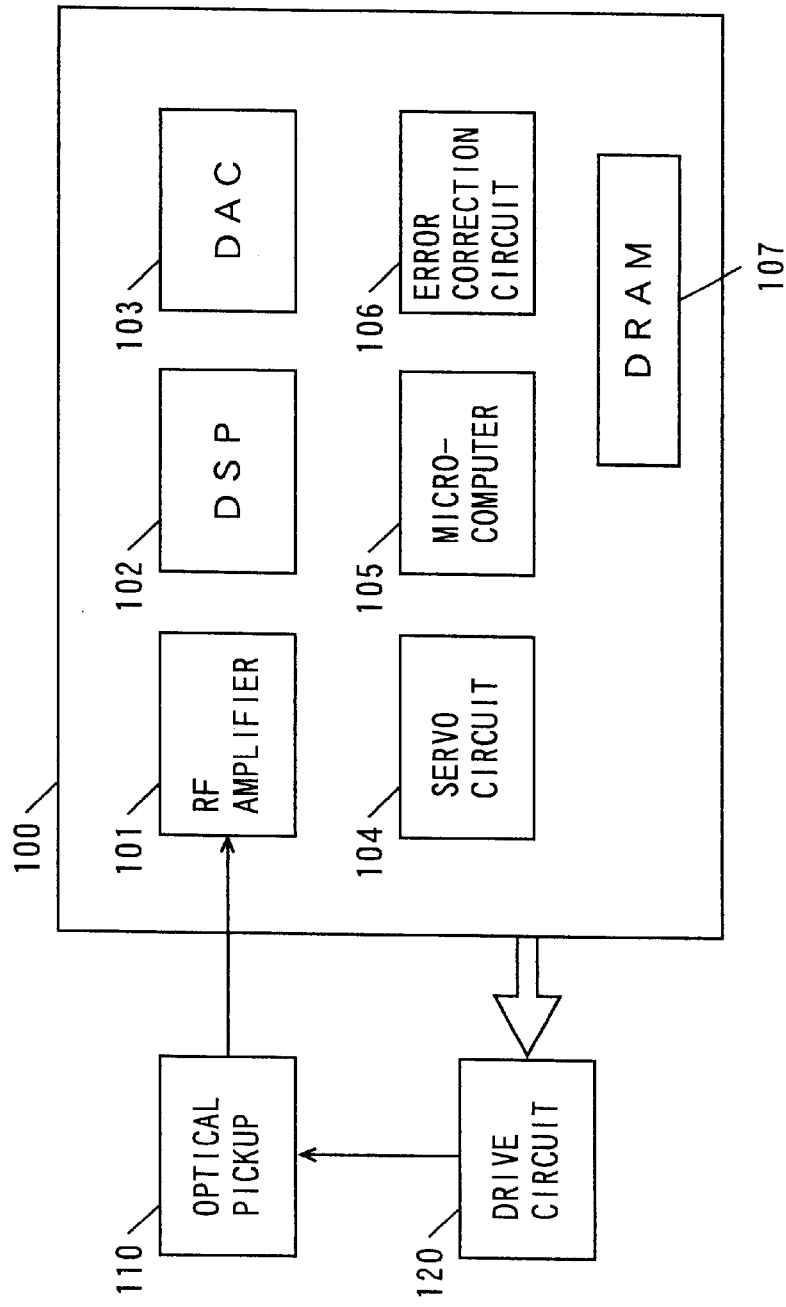
FIG. 5 is a block diagram showing the structure of a semiconductor integrated circuit for a CD-ROM drive including the RF amplifier shown in FIG. 4.

FIG. 5 is a block diagram showing the structure of a semiconductor integrated circuit 100 for a CD-ROM drive, including the RF amplifier shown in FIG. 4.

The semiconductor integrated circuit 100 shown in FIG. 5 includes an RF amplifier 101, a DSP 102, a DAC 103, a servo circuit 104, a microcomputer 105, an error correction circuit 106 and a DRAM 107.

The semiconductor integrated circuit 100 is a CMOS integrated circuit formed by integrating the RF amplifier 101, the DSP 102, the DAC 103, the servo circuit 104, the microcomputer 105, the error correction circuit 106 and the DRAM 107 into a single chip through a CMOS process. In consideration of the cost, the DRAM 107 may alternatively be formed as another chip while integrating the RF amplifier 101, the DSP 102, the DAC 103, the servo circuit 104, the microcomputer 105 and the error correction circuit 106 into a single chip as a CMOS integrated circuit and sealing the chips in the same package.

An optical pickup 110 converts data recorded on a CD-ROM disk to an RF signal and outputs the same to the RF amplifier 101. The RF amplifier 101, formed similarly to the RF amplifier shown in FIG. 4, generates a focus error signal, a tracking signal and a reproduced signal (EFM (eight to fourteen modulation) signal) etc. through the aforementioned processing and outputs these signals to the DSP 102.

The DSP 102 and the servo circuit 104 create a control signal for controlling the optical pickup 110 from the focus error signal and the tracking error signal etc., and output the control signal to a drive circuit 120. The drive circuit 120 drives an actuator provided in the optical pickup 110 in response to the input control signal, for controlling the optical pickup 110 to reproduce an excellent RF signal.

The error correction circuit 106 performs error correction on the reproduced data with the DRAM 107, converts the reproduced data to an analog signal through the DAC 103 and outputs the analog signal when reproducing a sound signal.

The microcomputer 240 serves as a system controller controlling operations of the overall drive, and transmits/receives data etc. to/from the DSP 102 etc. at need, so that the CD-ROM drive executes various operations.

Figure 6:
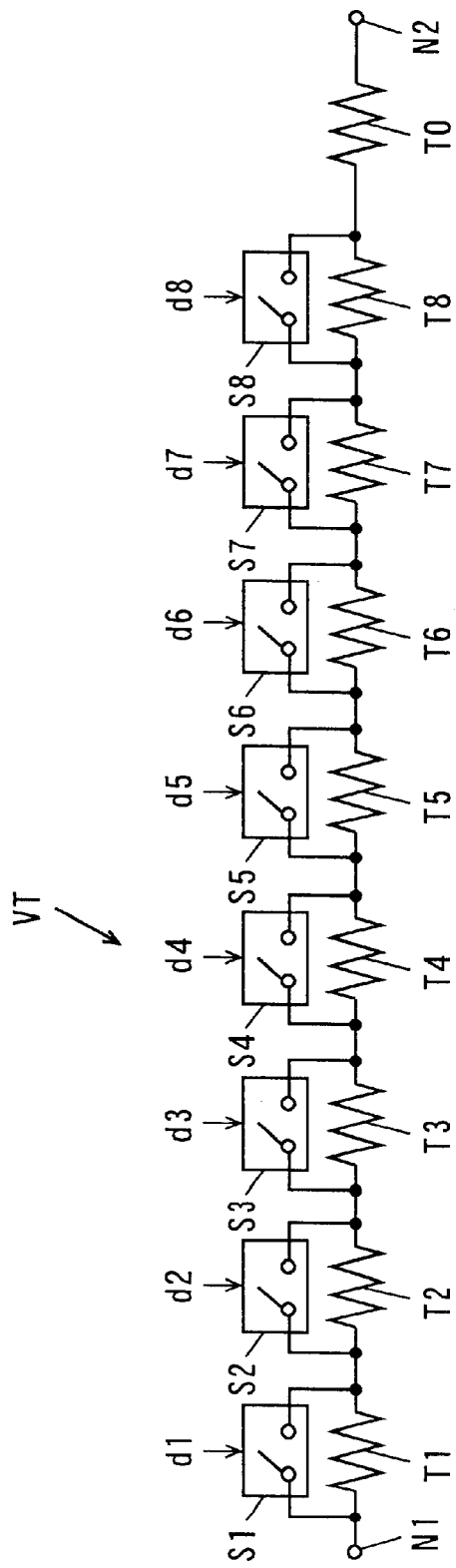
FIG. 6 is a circuit diagram showing the structure of a variable resistance circuit according to a second embodiment of the present invention.

As hereinabove described, the semiconductor integrated circuit 100 shown in FIG. 6 can be integrated into a single chip through the CMOS process along with other blocks by employing the RF amplifier 101 reduced in area and improved in precision, for implementing a miniature one-chip CMOS integrated circuit for a CD-ROM having high performance.

While the above description has been made with reference to the circuit for the CD-ROM drive, the circuit to which the inventive variable resistance circuit etc. are applied is not particularly restricted to this example but the present invention can, be similarly applied to various circuits requiring high precision, for attaining a similar effect.

(Second Embodiment)

Figure 7:
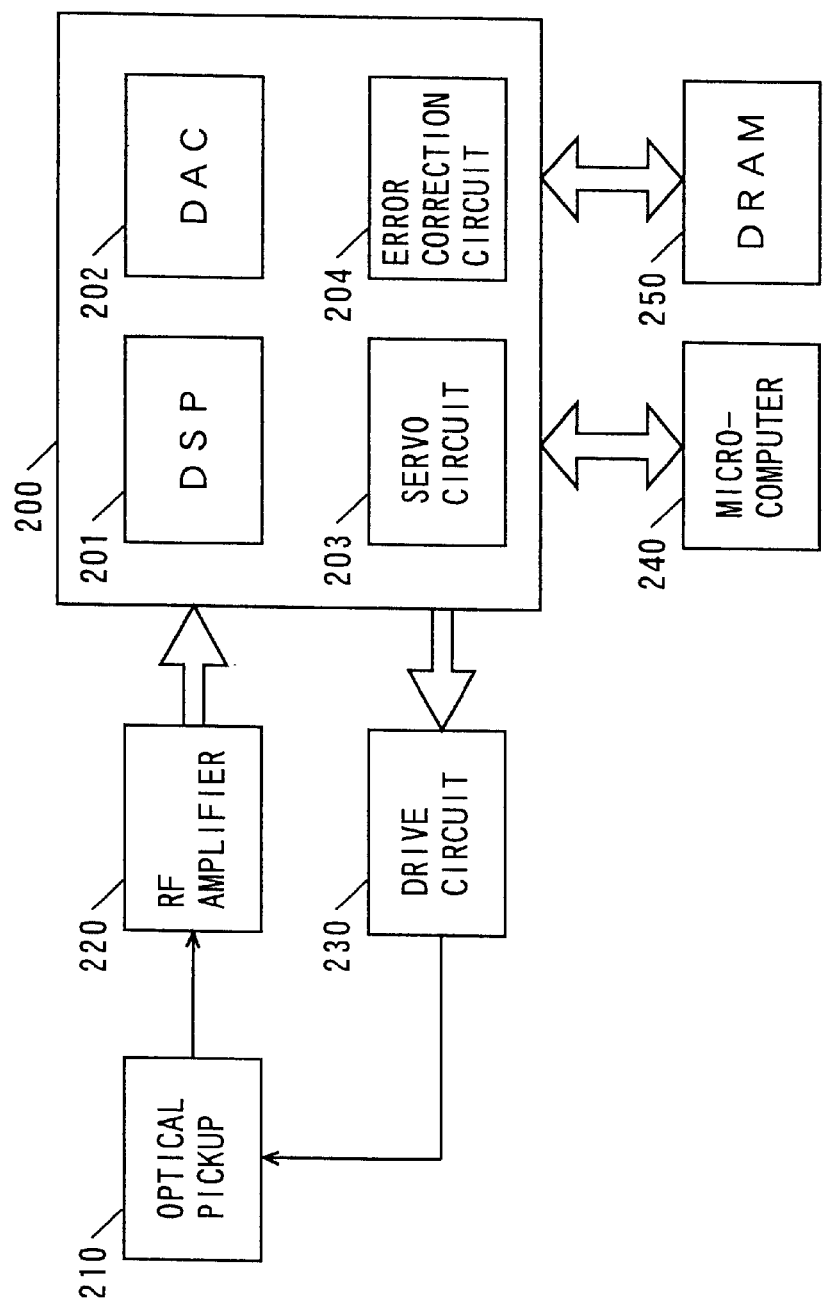
FIG. 7 is a block diagram showing the structure of a conventional semiconductor integrated circuit applied to a CD-ROM drive.
Figure 8:
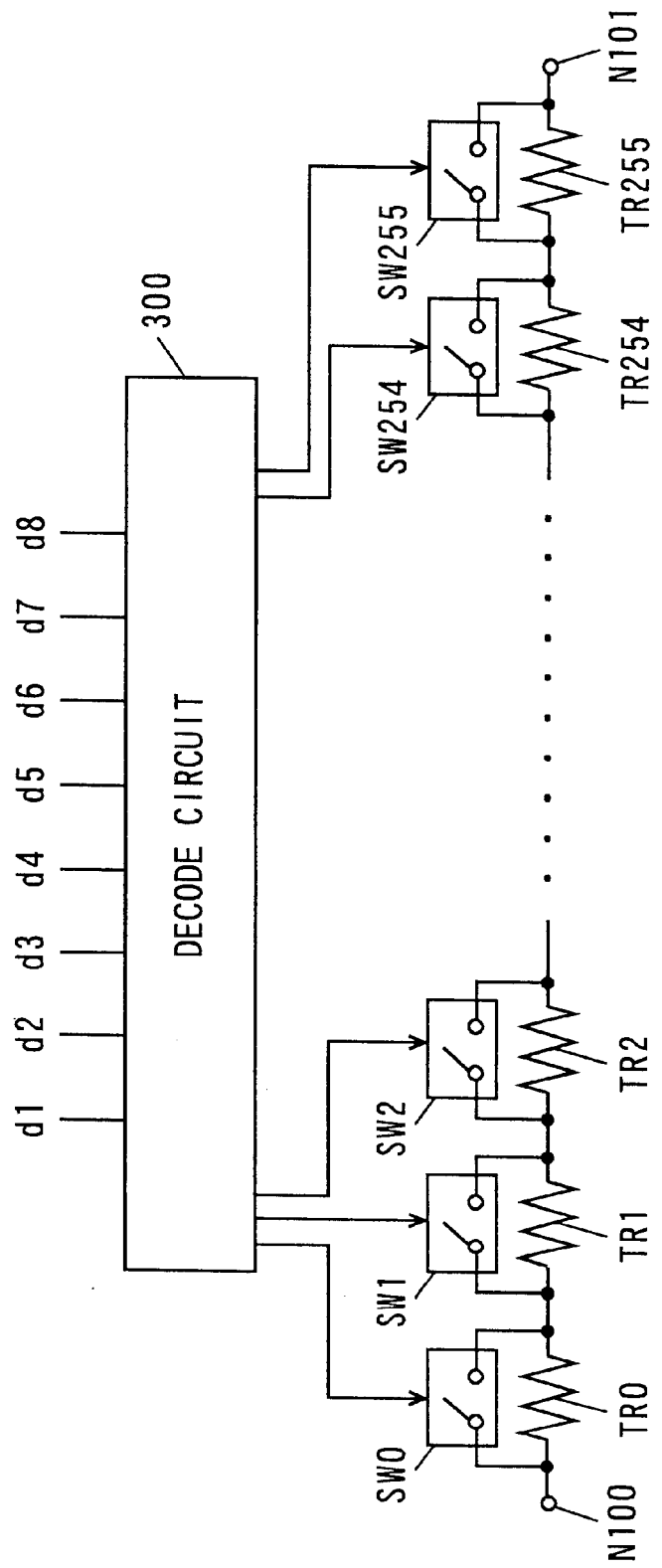
FIG. 8 is a circuit diagram showing the structure of a conventional variable resistance circuit.
Figure 9:
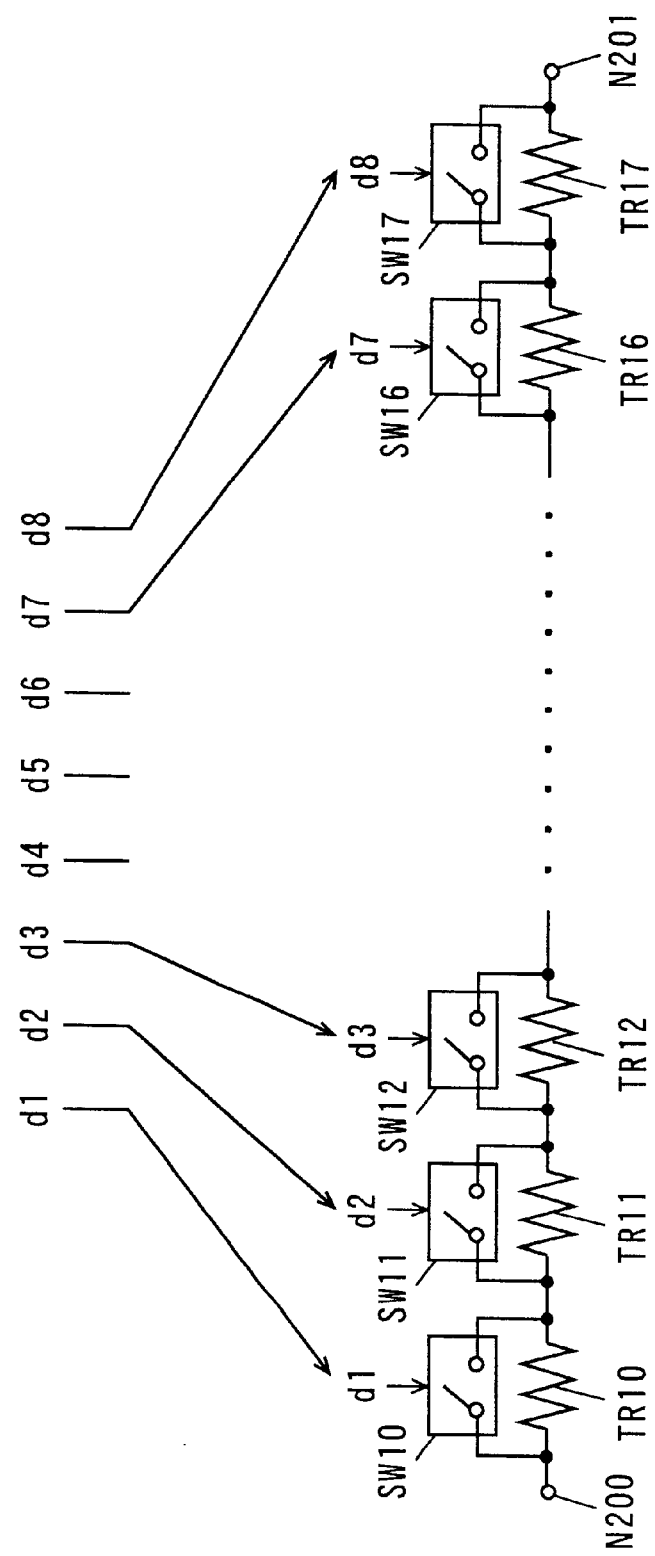
FIG. 9 is a circuit diagram showing the structure of another conventional variable resistance circuit.

A second embodiment of the present invention is described with reference to FIG. 7. FIG. 7 is a circuit diagram showing the structure of a variable resistance circuit VT according to the second embodiment. The second embodiment is different from the first embodiment only in a point that a resistor T0 is provided in series with a resistor T8 in the variable resistance circuit VT, and the remaining structure of the former is similar to that of the latter. The resistor T0 is a fixed resistor connected with no switch in a parallel manner.

When applying the variable resistance circuit VT according to the second embodiment to the operational amplification circuit shown in FIG. 3, the resistor T0 is located between the resistor T8 and the inversion input terminal of the operational amplifier 1. Thus, the fixed resistor T0 included in the variable resistance circuit VT can freely control the minimum amplitude of a gain.

Further, the resistor T0 is located between the resistor T8 and the inversion input terminal of the operational amplifier 1, whereby the signal of the output terminal N3 of the operational amplifier 1 passes through the resistors T1 to T8 and thereafter passes through the fixed resistor T0 to be fed back to the inversion input terminal of the operational amplifier 1. Thus, it follows that the parasitic capacitances of the switches S1 to S8 are present in front of the fixed resistor T0 and a parasitic capacitance generated in the rear stage of the fixed resistor T0 is extremely reduced, so that deterioration of the frequency characteristic can be prevented.

According to this embodiment, an operational amplification circuit having an excellent frequency characteristic and an integrated circuit employing this operational amplification circuit can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A variable resistance circuit that has a variable resistance value being gradually variable, comprising:
    a resistance circuit including a plurality of resistors serially connected; and
    a bypass circuit connected in parallel with said resistance circuit for bypassing one or more resistors selected from said plurality of resistors, wherein
        said bypass circuit includes a plurality of transistors selectively turned on or off,
        said variable resistance value is determined by a combined resistance value of a parasitic resistance of one or more transistors being turned on and one or more resistors being bypassed as well as a combined resistance value of one or more resistors being not bypassed, and
        gate widths of said plurality of transistors are so set that said variable resistance value varies approximately in steps of a predetermined value.

2. The variable resistance circuit according to claim 1, wherein
    said plurality of transistors are connected to ends of said plurality of resistors respectively.

3. A variable resistance circuit that has a variable resistance value being gradually variable, comprising:
    a resistance circuit including a plurality of resistors serially connected; and
    a switch circuit connected in parallel with said resistance circuit for bypassing one or more resistors selected from said plurality of resistors, wherein
        said switch circuit includes a plurality of switches selectively turned on or off,
        said variable resistance value is determined by a combined resistance value of a parasitic resistance of one or more switches being turned on and one or more resistors being bypassed as well as a combined resistance value of one or more resistors being not bypassed, and
        parasitic resistance values of said plurality of switches in an ON state are so set that said variable resistance value varies approximately in steps of a predetermined value.

4. The variable resistance circuit according to claim 3, wherein
    said plurality of switches include a plurality of transistors connected to ends of said plurality of resistors respectively.

5. The variable resistance circuit according to claim 3, wherein
    each of said plurality of switches include a CMOS switch.

6. A variable resistance circuit that has a variable resistance value being gradually variable, comprising:
    a resistance circuit including a plurality of resistors serially connected; and
    a bypass circuit connected in parallel with said resistance circuit for bypassing one or more resistors selected from said plurality of resistors, wherein
        said bypass circuit includes a plurality of transistors selectively turned on or off, said plurality of transistors are connected to ends of said plurality of resistors respectively, and
        gate widths of said plurality of transistors are so set that said variable resistance value varies approximately in steps of a predetermined value.

7. A variable resistance circuit that has a variable resistance value being gradually variable, comprising:
    a resistance circuit including a plurality of resistors serially connected; and
    a switch circuit connected in parallel with said resistance circuit for bypassing one or more resistors selected from said plurality of resistors, wherein
        said switch circuit includes a plurality of switches selectively turned on or off, said plurality of switches are connected to ends of said plurality of resistors, and
        parasitic resistance values of said plurality of switches in an ON state are so set that said variable resistance value varies approximately in steps of a predetermined value.

8. The variable resistance circuit according to claim 7, wherein
    each of said plurality of switches include a CMOS switch.

9. A variable resistance circuit that has a variable resistance value being gradually variable based on a control signal, comprising:
    a resistance circuit including a plurality of resistors serially connected; and
    a bypass circuit connected in parallel with said resistance circuit for bypassing one or more resistors selected from said plurality of resistors, wherein
        said bypass circuit includes a plurality of transistors selectively turned on or off based on said control signal,
        said variable resistance value is determined by a combined resistance value of a parasitic resistance of one or more transistors being turned on and one or more resistors being bypassed as well as a combined resistance value of one or more resistors being not bypassed, and
        gate widths of said plurality of transistors are so set that said variable resistance value has approximately linearity with respect to said control signal.

10. The variable resistance circuit according to claim 9, wherein
    said plurality of transistors are connected to ends of said plurality of resistors respectively.

11. A variable resistance circuit that has a variable resistance value being gradually variable based on a control signal, comprising:
    a resistance circuit including a plurality of resistors serially connected; and
    a switch circuit connected in parallel with said resistance circuit for bypassing one or more resistors selected from said plurality of resistors, wherein
        said switch circuit includes a plurality of transistors selectively turned on or off based on said control signal,
        said variable resistance value is determined by a combined resistance value of a parasitic resistance of one or more transistors being turned on and one or more resistors being bypassed as well as a combined resistance value of one or more resistors being not bypassed, and
        parasitic resistance values of said plurality of switches in an ON state are so set that said variable resistance value has approximately linearity with respect to said control signal.

12. The variable resistance circuit according to claim 11, wherein
    said plurality of switches include a plurality of transistors connected to ends of said plurality of resistors respectively.

13. The variable resistance circuit according to claim 11, wherein
each of said plurality of switches include a CMOS switch.

14. A variable resistance circuit that has a variable resistance value being gradually variable based on a control signal, comprising:
a resistance circuit including a plurality of resistors serially connected; and
a bypass circuit connected in parallel with said resistance circuit for bypassing one or more resistors selected from said plurality of resistors, wherein
said bypass circuit includes a plurality of transistors selectively turned on or off based on a control signal, said plurality of transistors are connected to ends of said plurality of resistors respectively, and
gate widths of said plurality of transistors are so set that said variable resistance value has approximately linearity with respect to said control signal.

15. A variable resistance circuit that has a variable resistance value being gradually variable based on a control signal, comprising:
a resistance circuit including a plurality of resistors serially connected; and
a switch circuit connected in parallel with said resistance circuit for bypassing one or more resistors selected from said plurality of resistors, wherein
said switch circuit includes a plurality of switches selectively turned on or off based on a control signal, said plurality of switches are connected to ends of said plurality of resistors respectively, and
predetermined resistance values of said plurality of switches in an ON state are so set that said variable resistance value has approximately linearity with respect to said control signal.

16. The variable resistance circuit according to claim 15, wherein
each of said plurality of switches include a CMOS switch.

17. An operational amplification circuit comprising:
a variable resistance circuit; and
an operational amplifier, connected with said variable resistance circuit, having an amplification factor varying with the resistance value of said variable resistance circuit, wherein
said variable resistance circuit includes:
a resistance circuit including a plurality of resistors serially connected; and
a bypass circuit connected in parallel with said resistance circuit for bypassing one or more resistors selected from said plurality of resistors, wherein
said bypass circuit includes a plurality of transistors selectively turned on or off, said plurality of transistors are connected to ends of said plurality of resistors respectively, and
gate widths of said plurality of transistors are so set that said variable resistance value varies approximately in steps of a predetermined value.

18. An operational amplification circuit comprising:
a variable resistance circuit; and
an operational amplifier, connected with said variable resistance circuit, having an amplification factor varying with the resistance value of said variable resistance circuit, wherein
said variable resistance circuit includes:
a resistance circuit including a plurality of resistors serially connected; and
a switch circuit connected in parallel with said resistance circuit for bypassing one or more resistors selected from said plurality of resistors, wherein
said switch circuit includes a plurality of switches selectively turned on or off, said plurality of switches are connected to ends of said plurality of resistors, and
parasitic resistance values of said plurality of switches in an ON state are so set that said variable resistance value varies approximately in steps of a predetermined value.

19. A semiconductor integrated circuit receiving an output signal from an optical pickup, comprising:
an operational amplification circuit amplifying said output signal from said optical pickup; and
another circuit, wherein
said operational amplification circuit and said another circuit are integrated into a single chip by a CMOS integrated circuit,
said operational amplification circuit includes:
a variable resistance circuit, and
an operational amplifier, connected with said variable resistance circuit, having an amplification factor varying with the resistance value of said variable resistance circuit,
said variable resistance circuit includes:
a resistance circuit including a plurality of resistors serially connected; and
a bypass circuit connected in parallel with said resistance circuit for bypassing one or more resistors selected from said plurality of resistors, wherein
said bypass circuit includes a plurality of transistors selectively turned on or off, said plurality of transistors are connected to ends of said plurality of resistors respectively, and
gate widths of said plurality of transistors are so set that said variable resistance value varies approximately in steps of a predetermined value.

20. A semiconductor integrated circuit receiving an output signal from an optical pickup, comprising:
an operational amplification circuit amplifying said output signal from said optical pickup; and
another circuit, wherein
said operational amplification circuit and said another circuit are integrated into a single chip by a CMOS integrated circuit,
said operational amplification circuit includes:
a variable resistance circuit, and
an operational amplifier, connected with said variable resistance circuit, having an amplification factor varying with the resistance value of said variable resistance circuit,
said variable resistance circuit includes:
a resistance circuit including a plurality of resistors serially connected; and
a switch circuit connected in parallel with said resistance circuit for bypassing one or more resistors selected from said plurality of resistors, wherein
said switch circuit includes a plurality of switches selectively turned on or off, said plurality of switches are connected to ends of said plurality of resistors, and
parasitic resistance values of said plurality of switches in an ON state are so set that said variable resistance value varies approximately in steps of a predetermined value.

* * * * *